US006910780B2

(12) United States Patent
Vail et al.

(10) Patent No.: US 6,910,780 B2
(45) Date of Patent: Jun. 28, 2005

(54) LASER AND LASER SIGNAL COMBINER

(75) Inventors: Ed Vail, Fremont, CA (US); Gideon Yoffe, Fremont, CA (US); Bardia Pezeshki, Redwood City, CA (US); Mark Emanuel, Fremont, CA (US); John Heanue, Fremont, CA (US)

(73) Assignee: Santur Corporation, Fremont, CA (US)

( * ) Notice: Subject to any disclaimer, the term of this patent is extended or adjusted under 35 U.S.C. 154(b) by 69 days.

(21) Appl. No.: 10/405,581

(22) Filed: Apr. 1, 2003

(65) Prior Publication Data

US 2004/0013431 A1 Jan. 22, 2004

Related U.S. Application Data

(60) Provisional application No. 60/369,492, filed on Apr. 1, 2002.

(51) Int. Cl.[7] .................................................. G02B 5/08
(52) U.S. Cl. ........................ 359/861; 359/857; 359/577; 385/24
(58) Field of Search ................................ 359/577, 615, 359/856, 861; 385/24

(56) References Cited

U.S. PATENT DOCUMENTS

| 3,924,937 A | 12/1975 | Munroe et al. |
| 4,317,611 A | 3/1982 | Petersen |
| 4,359,773 A | 11/1982 | Swartz et al. |

(Continued)

FOREIGN PATENT DOCUMENTS

| EP | 0924821 A1 | 6/1999 |
| FR | 2805092 | 8/2001 |
| JP | 56060088 | 5/1981 |

(Continued)

OTHER PUBLICATIONS

Menezo et al., "10–Wavelength 200–GHz Channel Spacing Emitter Integrating DBR Lasers with a PHASAR on InP for WDM Applications", *IEEE Phototonics Technology Letters*, Jul. 1999, pp. 785–787, vol. 11, No. 7.

International Search Report dated Jan. 21, 2003 for International Application No. PCT/US01/24969 and mailed Jan. 28, 2003 (3 pages).

(Continued)

*Primary Examiner*—Leonidas Boutsikaris

(74) *Attorney, Agent, or Firm*—Christie, Parker & Hale LLP

(57) ABSTRACT

An optical communication system for transmitting multiple optical beams, each at a different wavelength is disclosed. The optical communication system includes a laser array having multiple laser transmitters transmitting multiple optical beams, each at a different wavelength. The optical communication system further includes a diffraction grating optically coupled to the laser array, the diffraction grating diffracting each of the optical beams at a substantially equal diffraction angle to form a combined optical beam. The combined beam is then focused into an optical communication media.

8 Claims, 8 Drawing Sheets

U.S. PATENT DOCUMENTS

| | | | |
|---|---|---|---|
| 4,498,730 A | 2/1985 | Tanaka et al. | |
| 4,820,899 A | 4/1989 | Hikima et al. | |
| 5,136,598 A | 8/1992 | Weller et al. | |
| 5,228,050 A | 7/1993 | LaCourse et al. | |
| 5,274,489 A | 12/1993 | Smith et al. | |
| 5,283,796 A | 2/1994 | Fink | |
| 5,289,485 A | 2/1994 | Mooradian | |
| 5,291,502 A | 3/1994 | Pezeshki et al. | |
| 5,325,386 A | 6/1994 | Jewell et al. | |
| 5,378,330 A | 1/1995 | Li et al. | |
| 5,379,310 A | 1/1995 | Papen et al. | |
| 5,420,416 A | 5/1995 | Iida et al. | |
| 5,468,975 A | 11/1995 | Valster | |
| 5,491,576 A | 2/1996 | Bergano | |
| 5,504,609 A | 4/1996 | Alexander et al. | |
| 5,519,487 A | 5/1996 | Atwood et al. | |
| 5,550,850 A | 8/1996 | Lee et al. | |
| 5,612,968 A | 3/1997 | Zah | |
| 5,629,790 A | 5/1997 | Neukermans et al. | |
| 5,650,612 A | 7/1997 | Criswell et al. | |
| 5,699,589 A | 12/1997 | Ripley et al. | |
| 5,715,047 A | 2/1998 | Adamovsky | |
| 5,771,253 A | 6/1998 | Chang-Hasnain et al. | |
| 5,777,763 A | 7/1998 | Tomlinson, III | |
| 5,784,183 A | 7/1998 | Aoki et al. | |
| 5,784,507 A | 7/1998 | Holm-Kennedy et al. | |
| 5,798,859 A | 8/1998 | Colbourne et al. | |
| 5,808,986 A | 9/1998 | Jewell et al. | |
| 5,825,792 A | 10/1998 | Villeneuve et al. | |
| 5,882,468 A | 3/1999 | Crockett et al. | |
| 5,930,045 A * | 7/1999 | Shirasaki | 359/577 |
| 5,949,544 A | 9/1999 | Manning | |
| 5,953,359 A | 9/1999 | Yamaguchi et al. | |
| 5,959,750 A | 9/1999 | Eskildsen et al. | |
| 5,973,838 A * | 10/1999 | Shirasaki | 359/577 |
| 5,977,567 A | 11/1999 | Verdiell | |
| 5,993,544 A | 11/1999 | Knauss et al. | |
| 5,999,303 A | 12/1999 | Drake | |
| 5,999,545 A | 12/1999 | Jeon et al. | |
| 6,044,705 A | 4/2000 | Neukermans et al. | |
| 6,049,554 A | 4/2000 | Lang et al. | |
| 6,078,394 A | 6/2000 | Wood | |
| 6,091,537 A | 7/2000 | Sun et al. | |
| 6,121,983 A | 9/2000 | Fork et al. | |
| 6,133,615 A | 10/2000 | Guckel et al. | |
| 6,175,668 B1 | 1/2001 | Borrelli et al. | |
| 6,183,092 B1 | 2/2001 | Troyer | |
| 6,201,629 B1 | 3/2001 | McClelland et al. | |
| 6,212,151 B1 | 4/2001 | Heanue et al. | |
| 6,227,724 B1 | 5/2001 | Verdiell | |
| 6,256,328 B1 | 7/2001 | Delfyett et al. | |
| 6,275,315 B1 | 8/2001 | Park et al. | |
| 6,275,317 B1 | 8/2001 | Doerr et al. | |
| 6,316,764 B2 | 11/2001 | Heffner et al. | |
| 6,327,063 B1 | 12/2001 | Rockwell | |
| 6,350,064 B2 | 2/2002 | Mitsuda et al. | |
| 6,352,376 B2 | 3/2002 | Walters et al. | |
| 6,411,424 B1 | 6/2002 | Raj | |
| 6,434,291 B1 | 8/2002 | Kessler et al. | |
| 6,445,514 B1 | 9/2002 | Ohnstein et al. | |
| 6,483,969 B1 | 11/2002 | Yap et al. | |
| 6,516,017 B1 | 2/2003 | Matsumoto | |
| 6,522,793 B1 | 2/2003 | Szilagyi et al. | |
| 2001/0017876 A1 | 8/2001 | Kner et al. | |
| 2001/0036206 A1 | 11/2001 | Jerman et al. | |
| 2001/0050928 A1 | 12/2001 | Cayrefourcq et al. | |
| 2002/0064192 A1 | 5/2002 | Missey et al. | |
| 2002/0076480 A1 | 6/2002 | Hsieh et al. | |
| 2002/0085594 A1 | 7/2002 | Pezeshki et al. | |
| 2003/0128917 A1 * | 7/2003 | Turpin et al. | 385/24 |

FOREIGN PATENT DOCUMENTS

| | | |
|---|---|---|
| JP | 11326707 | 11/1999 |
| JP | 2002246699 | 8/2002 |
| WO | WO 95/13638 | 5/1995 |
| WO | WO 02/13343 A2 | 2/2002 |
| WO | WO 02/37069 A1 | 5/2002 |
| WO | WO 02/37621 A2 | 5/2002 |
| WO | WO 02/058197 A2 | 7/2002 |
| WO | WO 02/013343 A3 | 7/2003 |

OTHER PUBLICATIONS

International Search Report for International Application PCT/US02/25365, filed Aug. 08, 2002, mailed Feb. 13, 2003 (4 pages).

International Search Report dated Nov. 01, 2002 for International Application No. PCT/US01/45691 and mailed Jan. 06, 2003 (3 pages).

"Broadband Lightwave Sources and System", Gayton Photonics Ltd., http://www.infowin.org/ACTS/RUS/PROJECTS/ac065.htm, printed Oct. 17, 2000 (4 pages).

Dellunde, Jaume, "Laser diodes", http://www.geocities.com/jdellund/receng.htm, printed Aug. 08, 2001 (4 pages).

Hunter, D.K., et al., "Guided wave optical switch architectures. Part 1. Space switching", International Journal of Optoelectronics, vol. 9, No. 6, 1994 (pp. 477–487).

Solgaard, O., et al., "Optoelectronic Packaging Using Silicon Surface–Micromachined Alignment Mirrors", IEEE Photonics Technology Letters, vol. 7, No. 1, 1995 (pp. 41–43) (4 pages total).

Li, G.P., et al., "16–Wavelength Gain–Coupled DFB Laser Array with Fine Tunability", IEEE Photonics Technology Letters, vol. 8, No. 1, Jan. 1996 (pp. 22–24).

Gordon, C., "Hybrid Mode–Locked DBR–laser", Multidisciplinary Optical Switching Technology Center, http://www.ece.ucsb.edu/MOST/33.html, (last updated Jan. 22, 1996), printed Aug. 05, 2001 (3 pages).

Daneman, M. J., et al., "Laser–to–Fiber Coupling Module Using a Micromachined Alignment Mirror", IEEE Photonics Technology Letters, vol. 8, No. 3, Mar. 1996 (pp. 396–398).

Wu, M., "Micromachining for Optical and Optoelectronic Systems", Proceedings of the IEEE, vol. 85, No. 11, Nov. 1997 (pp. 1833, 1943–1952).

Jacques, S., "Phase conjugate mirror and diffraction grating yield stable, collimated, coherent, high–power diode laser.", Oregon Medical Laser Center Newsletter, http://omlc.ogi.edu/news/dec97/pclaser.html, printed Apr. 09, 2001, (2 pages).

Shirasaki, M., "Chromatic–Dispersion Compensator Using Virtually Imaged Phased Array", IEEE Photonics Technology Letters, vol. 9, No. 12, Dec. 1997 (pp. 1598–1600).

Kudo, K., et al., "Multiwavelength microarray semiconductor lasers", Electronics Letters, vol. 34, No. 21, Oct. 15, 1998, (pp. 2037–2039).

Kopka, P., et al., "Bistable 2×2 and Multistable 1×4 Micromechanical Fibre–optic Switches on Silicon", Micro Opto Electro Mechanical Systems, MOEMS 1999 (4 pages).

"(BW)(Oh–Marconi–Comm–2) Marconi Communications Announces World–Beating Commercial Tuneable Laser at Telecom '99", Press Release, http://www.businesswire.com/cgi–bin/ts_headline.sh?/bw.101199/192842212, Oct. 11, 1999, printed Oct. 17, 2000 (2 pages).

Maluf, N., "Optical switches", An Introduction to Microelectromechanical Systems Engineering, 2000, pp. 187–190 (3 pages).

Nakano, H., "Technological Trends of Optical Communication Devices for DWDM", NEC Device Technology International 2000, No. 59 (5 pages).

Liu, F., et al., "Cost–effective wavelength selectable light source using DFB fibre laser array", Electronics Letters, vol. 36, No. 7, Mar. 30, 2000, pp. 620–621, (3 pages).

Hunwicks, A., "Advancing the Optical Component", http://www.telecoms-mag.com/issues/200004/tci/advancing.html, Apr. 2000, printed Oct. 17, 2000 (6 pages).

Pezeshki, B., et al., "12nm tunable WDM source using an integrated laser array", Electronics Letters, vol. 36, No. 9, Apr. 27, 2000 (pp. 788–789).

Howe, P., "Light fantastic", digitalMASS as Boston.com, http://digitalmass.boston.com/news/daily/05/22/light_fantastic.html, printed Oct. 17, 2000 (5 pages).

Silverman, S., "VCs beam big bucks at optics upstarts", Redherring.com, Oct. 09, 2000, http://www.redherring.com/vc/2000/1009/vc-optics100900.html?id=yahoo, printed Oct. 10, 2000 (5 pages).

* cited by examiner

LASER AND LASER SIGNAL COMBINER

CROSS-REFERENCE TO RELATED APPLICATION

This application claims priority to U.S. Provisional Patent Application Ser. No. 60/369,492, entitled "LASER AND LASER SIGNAL COMBINER", filed Apr. 1, 2002, the contents of which are incorporated herein by reference as if set forth in full.

BACKGROUND

Optical communication systems using for example, optical fiber as a transmission medium, have low loss and very high information carrying capacity. In practice, the bandwidth of optical fiber may be better utilized to increase the bandwidth of a communication system by transmitting many distinct channels simultaneously using different carrier wavelengths. In WDM (wavelength division multiplexed) networks, for example, multiple optical signals each at different wavelengths are combined and transmitted over an optical fiber. WDM systems therefore sometimes utilize multiple laser sources that coupled into a single optical fiber.

SUMMARY OF THE INVENTION

In one aspect of the present invention an optical communication system includes a laser array having a plurality of laser transmitters transmitting a plurality of optical beams at a plurality of different wavelengths. The optical communication system further includes a diffraction grating optically coupled to the laser array, the diffraction grating diffracting each of the optical beams at a substantially equal diffraction angle to form a combined optical beam. The combined beam is then focused into an optical communication media.

In another aspect of the present invention an optical communication system includes a laser array having a plurality of laser transmitters transmitting a plurality of optical beams at a plurality of different wavelengths. In this aspect of the invention the optical communication system further includes a virtual image phased array optically coupled to the laser array. In this aspect of the invention the ratio of the angular separation between adjacent lasers in the array of lasers divided by the wavelength separation between the adjacent lasers in the laser array is approximately equal to the dispersion of the virtual image phased array so that the virtual image phased array combines the plurality of optical beams into a combined optical beam. An optical communication media optically coupled to the virtual image phased array, receives the combined optical beam.

In a further aspect of the present invention an optical communication system includes a laser array having a plurality of laser transmitters transmitting a plurality of optical beams at a plurality of different wavelengths. In this aspect of the invention the communication system further includes a waveguide grating coupler optically coupled to the laser array wherein the diffraction order of the grating matches the propagating mode of the waveguide. An optical communication media optically coupled to the waveguide grating coupler receives the combined optical beam.

In a still further aspect of the present invention an optical communication system includes a laser array having a plurality of laser transmitters formed on a common substrate transmitting a plurality of optical beams at a plurality of different wavelengths. In this aspect of the invention the communication system further includes an arrayed waveguide grating monolithically formed on the common substrate, wherein the arrayed waveguide grating receives the plurality of transmit optical beams and combines the plurality of optical beams into a combined optical beam. An optical communication media optically coupled to the arrayed waveguide grating receives the combined optical beam.

These and other aspects of the present invention are more readily understood upon viewing the figures indicated below in conjunction with the following detailed description.

DETAILED DESCRIPTION

Figure 1:
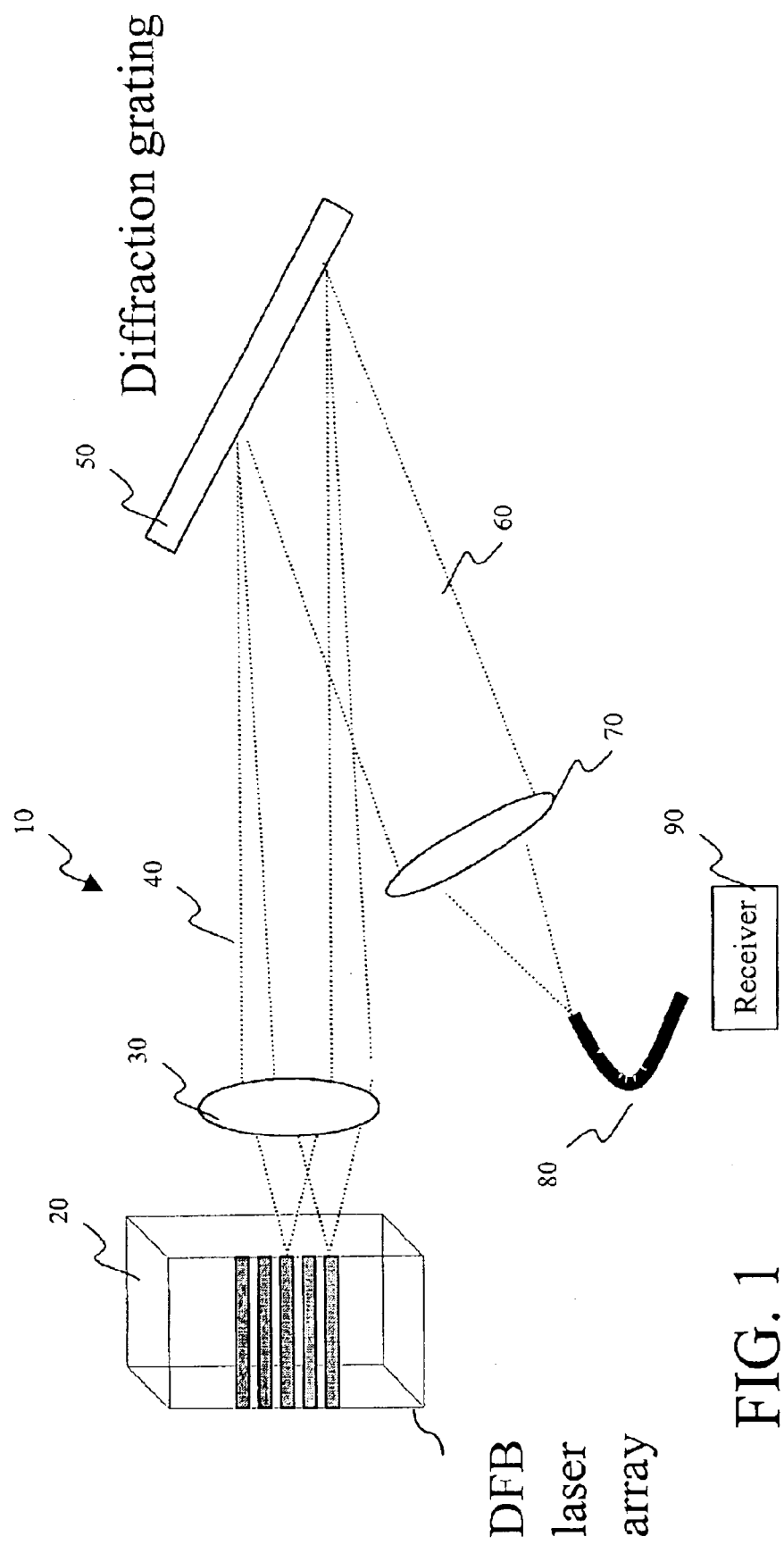
FIG. 1 illustrates one embodiment of an optical communications system for combining a plurality of transmit optical beams transmitted at a plurality of different optical wavelengths by a laser array into a single fiber.

An embodiment of the present invention provides an apparatus for coupling multiple optoelectronic sources into an optical communications medium. For example, FIG. 1 illustrates an optical communication system 10 with an array of lasers 20 optically coupled to a collimating lens 30. The collimating lens 30 collimates the output optical beam of each of the lasers in the laser array and forwards the collimated beams 40 to a diffraction grating 50 that diffracts each of the incoming beams at the same diffraction angle to form a combined optical beam 60. In this embodiment a coupling lens 70 collimates the combined optical beam and couples the collimated combined optical beam into an optical fiber 80. The optical fiber transports the combined optical signal to, for example, a receiver 90 and/or add/drop multiplexer that demultiplexes the combined ray in accordance with any of a variety of techniques known in the art.

In an embodiment of the present invention the array of lasers 20 is formed on a common substrate, with each laser having a different lasing wavelength. In addition, in one embodiment the lasers are, by way of example, controlled such that each laser in the laser array can be simultaneously turned on.

Figure 2:
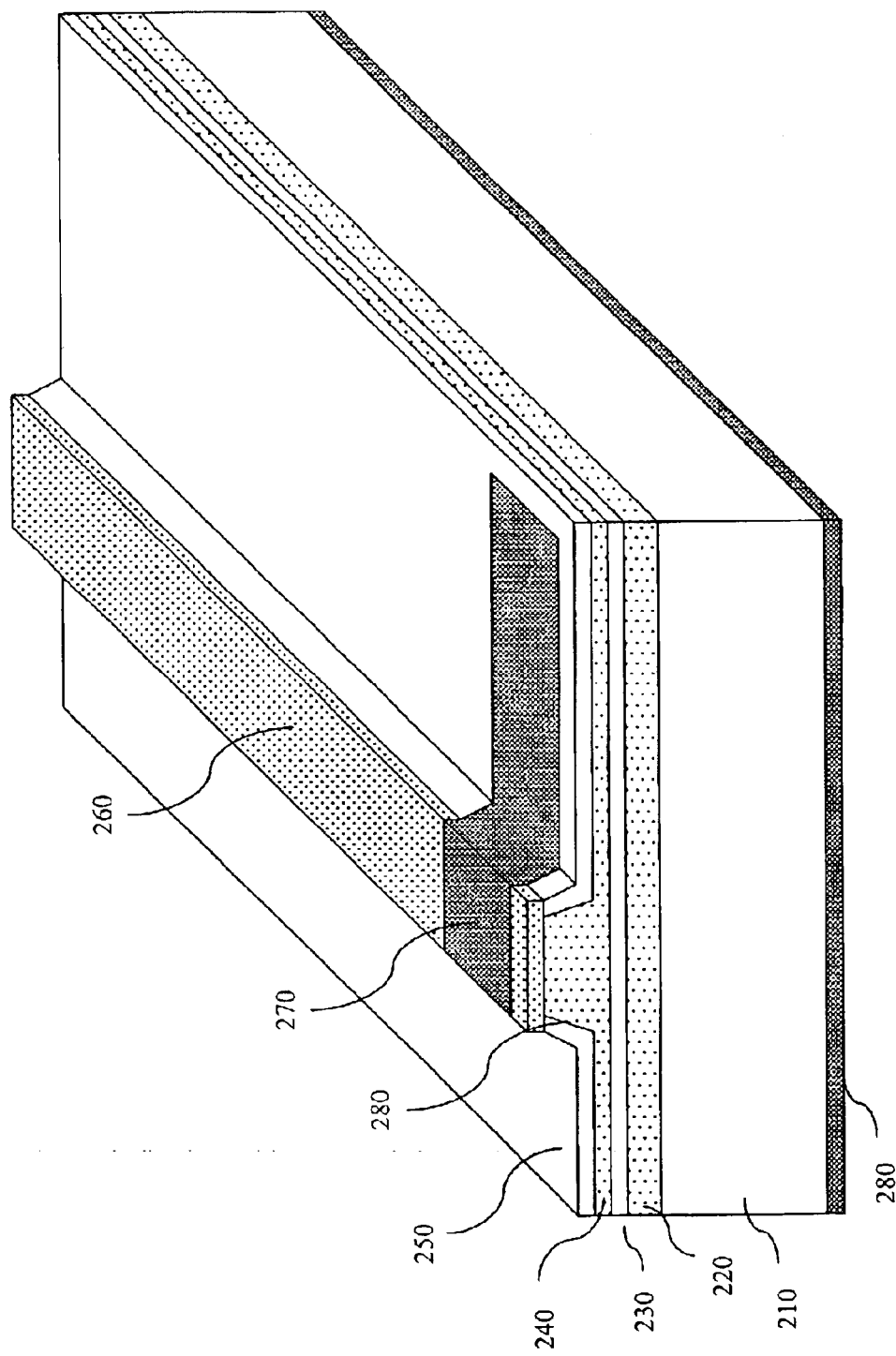
FIG. 2 illustrates a perspective cross-sectional view of a DFB laser suitable for use in the laser array of FIG. 1.

In one embodiment the array of lasers 20 are formed from a plurality of semiconductor waveguide lasers such as, for example, the ridge waveguide laser illustrated in FIG. 2. Each of the lasers in the array of lasers may be referred to as a laser stripe. In other embodiments buried heterostructure, buried rib, or other types of lasers are used.

Typically, the material composition of the waveguide lasers is some combination of group III–V compound semiconductors, such as GaAs/AlGaAs, InGaAs/AlGaAs or InP/InGaAsP. However, other direct bandgap semiconductor materials may also be used.

In this embodiment any one of a number of techniques may be used to assign different wavelengths to each laser. For example, directly-written gratings with electron beam lithography, stepping a window mask during multiple holographic exposures, UV exposure through an appropriately fabricated phase mask, or changing the effective index of the mode of the lasers may be used to assign different wavelengths to each laser.

In some embodiments, a controlled phase shift is also included in the laser or gain/loss coupling is used in the grating for stable single mode characteristics. The wavelength of such lasers can be accurately controlled by varying dimensional features, such as stripe width or layer thickness, across the array.

In one embodiment the lasers may be epitaxially grown on an n-type indium phosphide (InP) substrate 210. As is conventional in the art, the laser comprises an un-doped active region 230 disposed between an n-type layer 220 and a p-type layer 240. In an exemplary embodiment, the p-type layer may be doped with suitable dopants known in the art, such as, for example, zinc (Zn) and the n-type layer may be doped with a suitable dopant such as, for example, silicon (Si).

For example, in one embodiment an n-type InP lower cladding layer 220 may be epitaxially formed adjacent the substrate 210. An undoped active region 230 comprising at least one small-bandgap InGaAsP quaternary active layer sandwiched between a pair of InGaAsP barrier layers (not explicitly shown) is then formed on the lower cladding layer 220 followed by an upper p-type InP cladding layer 240. One of skill in the art will appreciate that the fractional concentrations of In, Ga, As and P may be varied to provide bandgap energy levels as may be preferable for the formation of the laser diode and low loss optical waveguide.

In this embodiment the upper p-type InP cladding layer 240 is etched in the shape of a ridge using conventional photolithography. For a DFB laser, the growth of the device may be interrupted approximately midway through the process and a grating etched into the laser (not shown). After the ridge is etched, the wafer is coated with an insulating dielectric 250, such as silicon nitride. In this embodiment the dielectric is then removed from on top of the ridge.

A conductive coating or metallization 260 is then applied to the top of the ridge. A second metallization step provides a contact region 270, shown at the end of the stripe. In an exemplary embodiment a conductive layer or metallization 280 may also be deposited on the backside of the substrate 210 to form an electrical contact.

In operation, current flowing vertically through the laser, from the upper cladding layer 240 to the substrate contact 280, causes the laser to lase. More specifically, light is generated in the active region 230 and confined by the lower cladding layer 220 and the upper cladding layer 240. The light is guided longitudinally by the ridge structure, which has been etched into the top cladding layer 240. As a result, the light is confined to oscillate between a partially or anti-reflecting front facet and a highly reflecting rear facet (not shown).

Returning to FIG. 1, in this embodiment, the stripes in the laser array are translated relative to the focal point of the collimating optical lens 30. Therefore, the collimating optical lens 30 presents a different compound angle to each of the laser stripes in the laser array. Accordingly, each of the collimated optical beams 40 are incident upon the diffraction grating 50 at a slightly different angle of incidence in accordance with the separation between stripes in the laser array.

In this embodiment the focal length of the collimating lens 30, the period of the grating, and the positions of the optical elements are chosen such that the diffraction angle is approximately the same for each beam transmitted by the laser array. Coupling lens 70 then couples the diffracted beams into the same optical fiber 80.

For example, diffraction from a periodic grating is governed by the grating equation given below.

$$\frac{m\lambda}{d} = \sin(\theta i) + \sin(\theta d)$$

where m is an integer representing the diffraction order, d is the grating period, $\lambda$ is the wavelength of the light incident upon the grating, $\theta i$ is the angle of incidence, and $\theta d$ is the diffraction angle. In practice both the angle of incidence and the diffraction angle are measured from the normal of the grating surface.

In one embodiment the array of lasers is located at the focal point of the collimating lens 30 (see FIG. 1). Thus if $x_n$ is the distance from the center laser stripe to the nth laser stripe, the grating equation may written as follows for an array of n lasers.

$$\frac{m(\lambda_n)}{d} = \sin\left(\theta_i + a\sin\left(\frac{x_n}{F}\right)\right) + \sin\theta_d$$

where $\theta i$ is the angle of incidence of the beam transmitted by the center laser stripe on the grating, $\lambda_n$ is the wavelength separation between channel and F is the focal length of the collimating lens.

In this embodiment, the plurality of transmit optical beams optimally couple into the optical fiber when the diffraction angle for each beam incident on the grating is equal. Therefore, assuming that x<<<F optimal coupling into a single fiber occurs when the difference in wavelength $\Delta\lambda$ between two stripes separated by a distance $\Delta x$ is given by:

$$\Delta\lambda = \frac{d \cdot \Delta x}{m \cdot F} \cdot \cos(\theta i)$$

Therefore, the difference in transmission wavelengths for optimal coupling decreases with decreasing grating period, d, and increasing angles of incidence $\theta i$. For example, in one embodiment the distance between adjacent laser stripes is 8 $\mu$m and the center wavelength of the laser array is 1545 nm. In this embodiment the focal length of the collimating lens is 2 mm so that at normal incidence, the minimum grating period for which a diffraction order exists is 1545 nm. At this grating period, the diffraction angle is 90 degrees, which generally is not practical. However, the diffraction angle for a grating period of 1.6 $\mu$m is approximately 75 degrees providing an achievable wavelength separation of 6.4 nm.

Therefore, in some embodiments the grating is swept relative to the optical path of the collimated beams. For example, in one embodiment the collimated beams are incident on the grating at an angle of incidence of about 78.4 degrees. In this embodiment the grating has, by way of example, a grating period of 1.0 μm which provides a wavelength spacing i.e. the minimum wavelength separation between adjacent lasers for optimal coupling of approximately 0.8 nm. The wavelength separation in this embodiment corresponds to an optical frequency of 100 GHz, a typical channel spacing in DWDM (dense wave division multiplex) networks.

Figure 3:
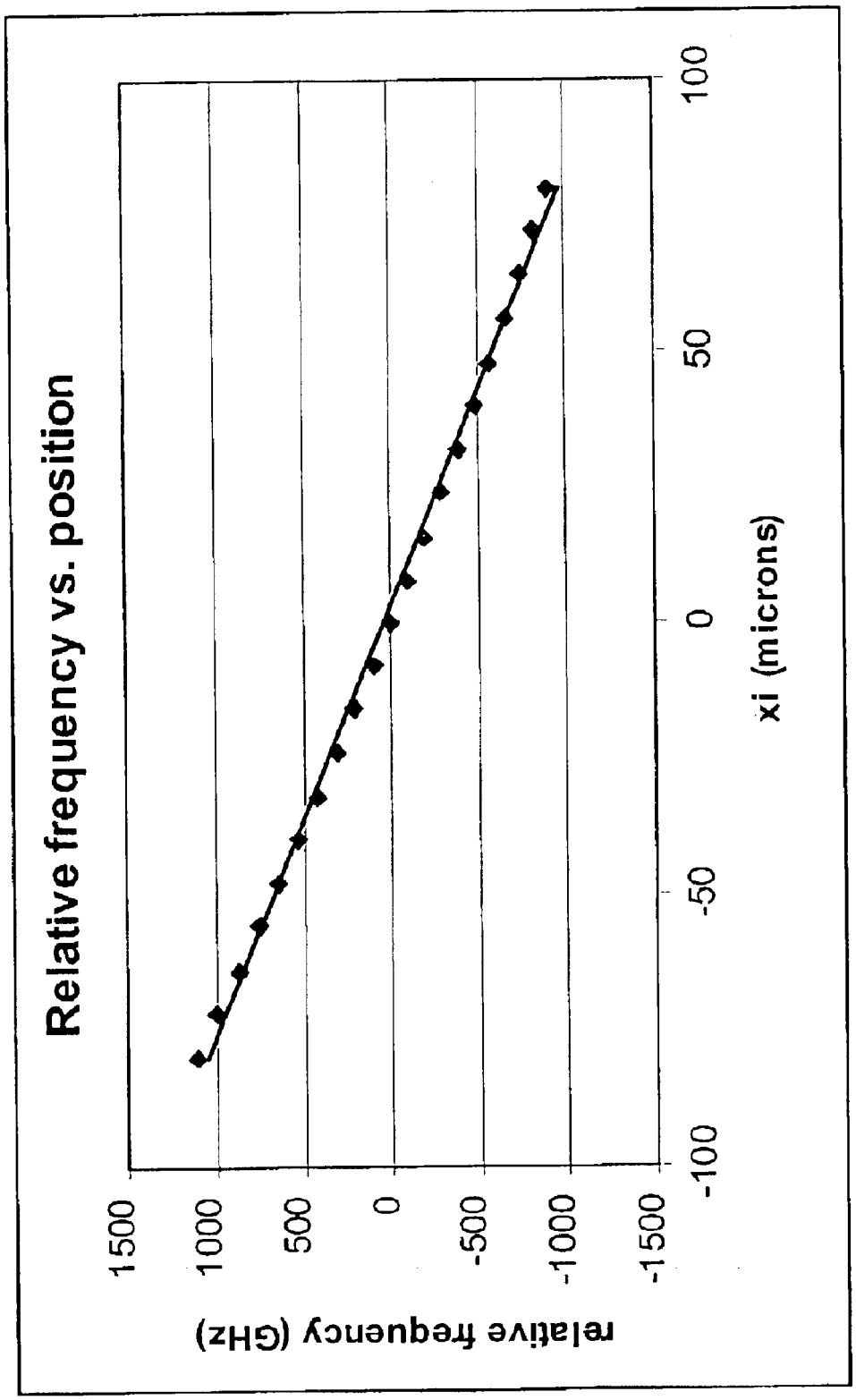
FIG. 3 graphically illustrates the relationship between laser frequency and stripe position of the lasers in the laser array of FIG. 1.

However, for this optical arrangement the relationship between laser frequency and stripe position is slightly nonlinear, as shown in FIG. 3. Therefore, in an exemplary embodiment the spacing between adjacent lasers in the array of lasers of FIG. 1 is slightly nonlinear to provide accurate frequency separation.

In some embodiments the grating is, by way of example, placed at the rear focal plane of the collimating lens of FIG. 1 to achieve optimum coupling efficiency. In addition, the diffraction angle for this embodiment is approximately 34.4 degrees. Therefore it may be difficult to separate the diffracted beams from the forward beams without clipping the forward beams for this lens-grating spacing and orientation.

Figure 4:
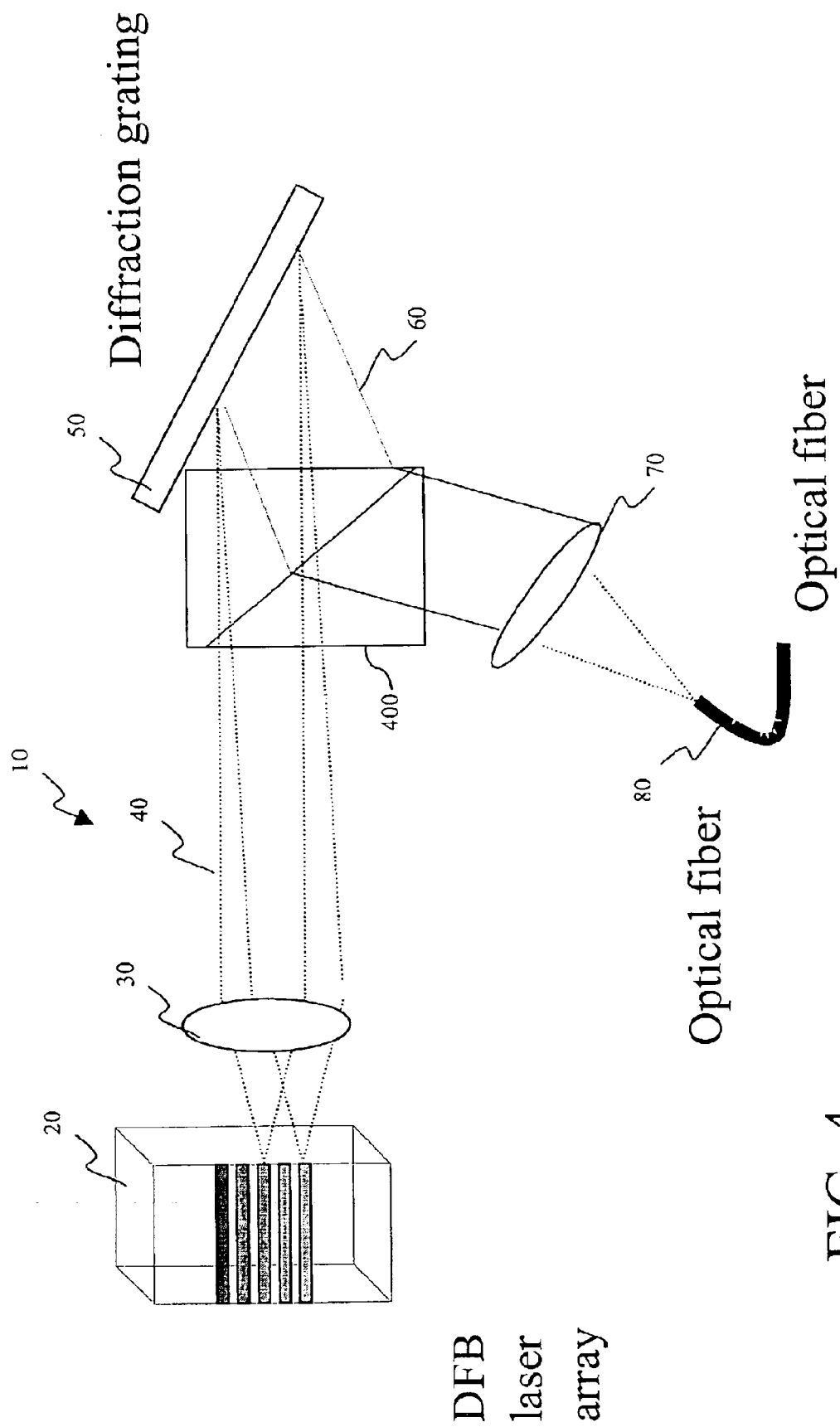
FIG. 4 illustrates another embodiment of an optical communications system for combining a plurality of transmit optical beams transmitted at a plurality of different optical wavelengths by a laser array into a single fiber.

Therefore, referring to FIG. 4, in one embodiment a beam splitter 400 may be inserted into the optical path to direct the diffracted beam 60 out of the forward beam path toward the coupling lens 70. However, the inclusion of the beam splitter may reduce the efficiency of the optical system. Therefore, in other embodiments a transmission, grating rather than a reflection grating may be used. In this case, the diffracted beams are easily accessed however, it may be more difficult to achieve a high-efficiency grating.

One of skill in the art will appreciate that the coupling efficiency into the optical fiber decreases as the differences between the diffraction angles of the diffracted optical beams increases. Therefore, one embodiment further includes a laser wavelength controller coupled to the laser array that controls the temperature of the laser array or the excitation current supplied to the laser transmitters to compensate for loss associated with mismatches that may be present between the diffraction angle associated with the various laser transmitters.

Figure 5:
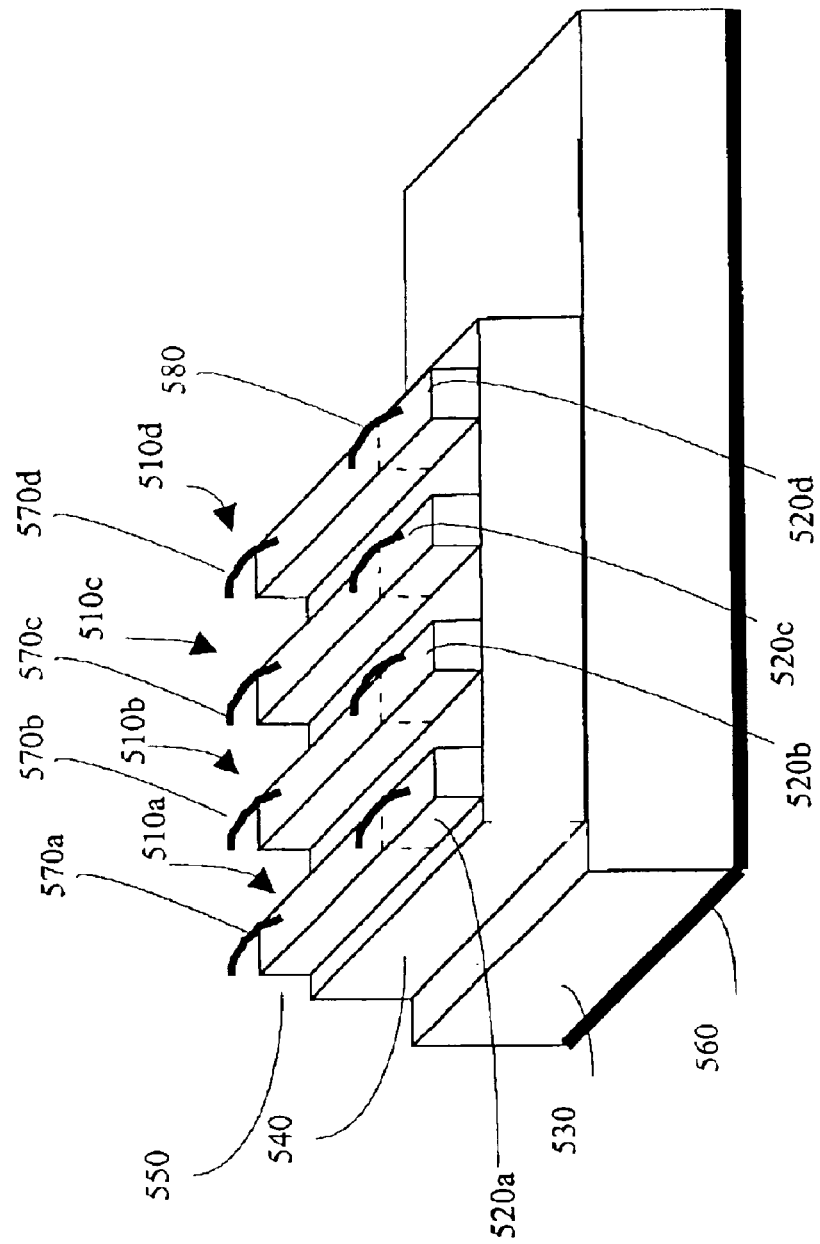
FIG. 5 illustrates a perspective cross-sectional view of a DFB laser array with integrated electro-absorption modulators suitable for use in the laser array of FIG. 1 or FIG. 4.

The described exemplary laser combiner may also be utilized to combine the output from an array of monolithic integrated laser-modulator devices as illustrated in FIG. 5. In this embodiment, corresponding electro-absorption modulators 520a–d are coupled to one or more of the plurality of lasers 510a–d that form the laser array 500. For example, laser 510a is coupled to electro-absorption modulator 520a. In this embodiment, the electro-absorption modulators modulate the output of the correponding laser output.

In one embodiment the optoelectronic device 500 comprises an active region 540 disposed between a substrate 530 that also serves as a lower cladding layer and a partially etched upper cladding layer 550 that forms a ridge type waveguide having an inverted mesa structure. In this embodiment a lower electrode 560 is disposed below the substrate 530 and separate upper electrodes (not specifically shown) are formed on the upper surface of the electro-absorption modulators 520a–d and on the upper surface of the lasers 510a–d.

In this embodiment each of the lasers are driven by a common drive signal. In other embodiment the lasers are driven by separate drive signals for independent device operation using separate drive signal lines 570a–d. Similarly, each of the electro-absorption modulators are also driven by separate information signals using separate data signal lines (e.g. 580).

As previously described with respect to FIG. 1, the spacing between stripes in the array of lasers may be on the order of 10 μm or less. In some embodiments such relative spacing between lasers may result in heat from laser stripes affecting operation of adjacent laser stripes. Accordingly, in some embodiments a thermoelectric (TE) cooler (not shown) is thermally coupled to the semiconductor device 500 to control the temperature of the lasers. The TE cooler may be abutting or near the semiconductor device or may be mounted outside of the housing (not shown).

As is known in the art, the TE cooler heats and cools the laser as required to drive the output wavelength of the laser to the desired wavelength. However, the time required to tune the devices with a TE cooler may be relatively long, often on the order of a second. For many applications, such as wavelength provisioning in the SONET telecommunication format, much faster tuning times on the order of milliseconds is preferred.

Therefore, one embodiment of the present invention further includes resistive elements coupled to each laser stripe to fine tune the temperature of individual lasers on a per laser stripe basis. Examples of structures and methods for tuning on a per laser stripe basis may be found, for example, in U.S. patent application Ser. No. 10/000,141, filed Oct. 30, 2001, entitled LASER THERMAL TUNING, the disclosure of which is incorporated herein by reference as if set forth in full.

Figure 6:
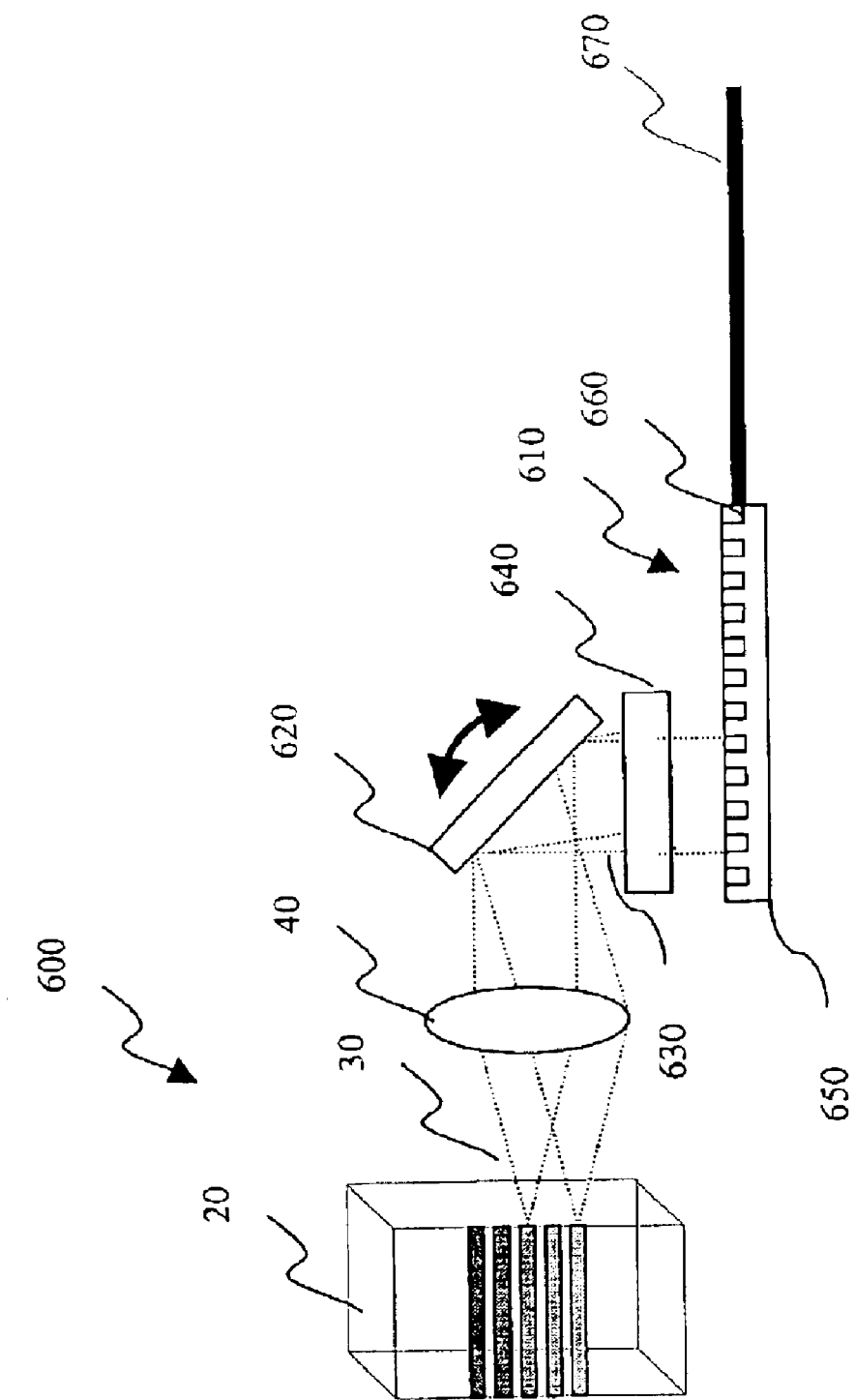
FIG. 6 illustrates an embodiment of an optical communications system for combining a plurality of transmit optical beams transmitted at a plurality of different optical wavelengths by a laser array into a single fiber.

An alternative optical communication system 600 having a more compact geometry is shown in FIG. 6. In this embodiment an optical waveguide grating coupler 610 combines beams from multiple sources in a laser array 20 and couples them into an optical transmission media, such as an optical fiber 670. In this embodiment the array of lasers 20 is again optically coupled to a collimating lens 30. The collimating lens 30 collimates the output optical beam of each of the lasers in the laser array and forwards the collimated beams 40 to a reflective element 620 which forwards reflected beams 630 to a cylindrical lens 640. The cylindrical lens 640 focuses the reflected beams into the optical waveguide grating coupler 610.

In one embodiment the reflective element is, by way of example, a micro mirror, such as, for example, a micro-electrical-mechanical structure (MEMS). In this embodiment the micro-mirror fine-tunes the alignment between the array and the grating so that the coupled wavelengths properly align with the grating grid.

In one embodiment optical waveguide 650 comprises, for example, an integrated optical silica waveguide formed on a planar silicon substrate (not explicitly shown). In this embodiment the waveguide is formed by depositing base, core and cladding layers on a silicon substrate. In one embodiment the base layer can be made of undoped silica to isolate the fundamental optical mode from the silicon substrate thereby preventing optical loss at the silica substrate interface.

The core layer is, by way of example, silica doped with an appropriate dopant such as phosphorus or germanium to increase its refractive index to achieve optical confinement. In one embodiment the cladding comprises a silica layer that is doped with appropriate dopants such as boron and/or phosphorus to facilitate fabrication and provide an index matching that of the base. The waveguide is formed using well-known photolithographic techniques.

In this embodiment the grating 660 is, by way of example, composed of multiple periodic elements of substantially equal length formed on an upper surface of the optical waveguide. The grating elements intersect the optical waveguide perpendicularly to its length.

In this embodiment optical beams incident on the grating 660 couple into the optical waveguide 650 when the diffraction order of the grating matches the propagating mode of the waveguide. The conditions for coupling into the waveguide may be determined as follows:

$$\beta = \frac{2 \cdot \pi}{\lambda} \cdot \left(n \cdot \sin(\theta) - i \cdot \frac{\lambda}{\Lambda}\right)$$

where $\beta$ is the propagation constant for the waveguide mode, i is the diffracted order of the grating, n is the refractive index of the waveguide, $\theta$ is the angle of incidence, $\lambda$ is the wavelength of the incident optical beam, and $\Lambda$ is the grating spacing.

As previously described with respect to FIG. 1, the stripes in the laser array 20 are offset from the focal point of the collimating optical lens 30. Therefore, the collimating optical lens presents a unique compound angle to each of the laser stripes in the laser array. Accordingly, each of the collimated optical beams 40 at different optical wavelengths are incident upon the reflective element 620 at a slightly different angle of incidence in accordance with the separation between adjacent stripes in the laser array.

Therefore, the reflective element 620 reflects each of the collimated optical beams at a different angle so that each of the beams transmitted by the laser is incident upon the waveguide grating array 620 at a different angle of incidence. Therefore, the spacing of the laser stripes in the laser array which operate at predetermined channel spacings may be chosen to provide optimal coupling into the output optical fiber.

In this embodiment the output fiber 670 is, by way of example, butt-coupled to the waveguide grating coupler 610. However, in other embodiments a lens is coupled between the waveguide grating coupler 610 and the fiber 670 to focus the combined beam into the fiber. In addition, in some embodiments the micro-mirror is used to adjust the alignment between the array and the grating to compensate for temperature induced wavelength drift in the transmit optical beams as well as for temperature induced variations in the performance of the waveguide grating coupler.

Another embodiment of the present invention includes a virtual image phased array (VIPA) which combines the light from the plurality of sources into a single fiber. The VIPA has optical properties analogous to a high angular-dispersion grating. (See for example "*Large Angular Dispersion By A Virtually Imaged Phased Array And Its Application To A Wavelength Demultiplexer*" by M. Shirasaki, Optics Letters, Vol. 21, No. 5, Mar. 1, 1996, the disclosure of which is incorporated herein by reference as if set forth in full).

Figure 7:
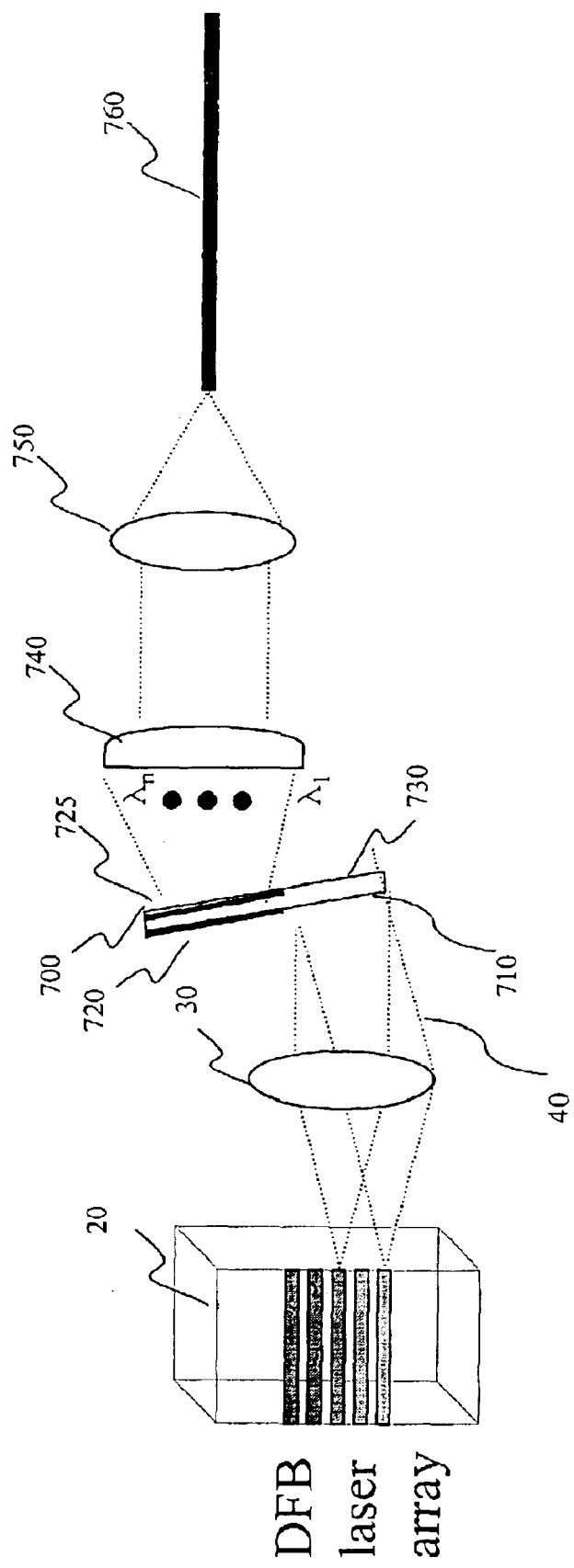
FIG. 7 illustrates another embodiment of an optical communications system for combining a plurality of transmit optical beams transmitted at a plurality of different optical wavelengths by a laser array into a single fiber.

Referring to FIG. 7, in this embodiment the array of lasers 20 again transmits a plurality of optical beams, each at a different wavelength. The transmitted optical beams are again optically coupled to the collimating lens 30. The collimating lens 30 collimates the output optical beam of each of the lasers in the laser array and forwards the collimated beams 40 to VIPA 700.

The VIPA forwards a combined optical waveform including each of the plurality of optical beams to a cylindrical lens 740. The cylindrical lens 740 converts the combined waveform to a uniform waveform which is forwarded to a focusing lens 750 that focuses the uniform waveform into a single optical fiber 760.

The VIPA is formed from a plate 710 made of an optically transparent material, such as, for example, glass, having reflective coatings 720 and 725 formed thereon. In one embodiment reflective coating 725 has, by way of example, a reflectance of approximately 95% or higher, but less than 100%. In this embodiment, reflecting coating 720 has a reflectance of approximately 100%. The VIPA 700 further includes a low reflectivity region 730 formed on the plate that is optically coupled to the collimating lens to receive the collimated optical beams.

In this embodiment the VIPA 700 outputs optical beams at an output angle that varies as a function of the wavelength of the input light and angle of incidence. For example, when input light 40 is at a wavelength $\lambda_1$ and incidence angle $\theta$, VIPA 700 outputs an optical beam at wavelength $\lambda_1$ in a specific angular direction. Similarly, when input light 40 is at a wavelength $\lambda_2$ with the same incidence angle, VIPA 700 outputs an optical beam at wavelength $\lambda_2$ in a different angular direction. Therefore, if the laser array transmits optical beams at wavelengths $\lambda_1$-$\lambda_n$ are incident on the VIPA at the same incident angle, the VIPA simultaneously outputs separate optical beams at wavelengths $\lambda_1$-$\lambda_n$ in different directions.

However, in this embodiment the stripes in the laser array 20 are again translated relative to the focal point of the collimating optical lens 30. Therefore, the collimating optical lens presents a unique compound angle to each of the laser stripes in the laser array. Accordingly, each of the collimated optical beams 40 at unique frequencies are incident upon the VIPA 700 at a slightly different angle of incidence as a function of the separation between laser stripes.

In this embodiment the plurality of optical beams transmitted by the laser array optimally couple into the optical fiber when the ratio of the angular separation between adjacent stripes divided by the wavelength separation between adjacent stripes is approximately equal to the dispersion (i.e. angular change in output signal divided by the change in wavelength) of the VIPA. For example, the dispersion for a 0.100 mm thick glass plate installed at a small angle of incidence to the incoming optical beam is on the order of 1 deg/nm. Therefore, in this embodiment the transmit optical beams will optimally coupled into the optical fiber if the dispersion (i.e. the ratio of the spacing and wavelength separation between adjacent stripes) is equal to approximately 1 deg/nm.

In one embodiment the DFB array has a spacing, $\Delta x$, of 8 $\mu$m between elements. The array in this embodiment is, by way of example, located at the focal point of a collimating lens having a 1 mm focal length, F. Therefore, the angular separation of the elements (i.e. $\sin^{-1}(\Delta x/f)$) in this embodiment is approximately 0.5 deg. Therefore, in this embodiment the wavelength separation between adjacent sources is on the order of 0.5 nm to match the dispersion of the VIPA to optimally couple the transmit optical beams into the output optical fiber.

In one embodiment the VIPA 700 is, by way of example, rotated to optimally align the DFB laser array 20 with the output fiber. Alternatively a MEMs mirror may be optically coupled between the collimating lens 20 and VIPA 700 or between the cylindrical lens 740 and the fiber coupling lens 750 to provide the necessary alignment. The MEMs mirror may also adjust the alignment to compensate for temperature induced variation in the system.

In an alternate embodiment a dispersive component such as an Eschelle grating or an arrayed waveguide grating (AWG) is integrated with the laser array to provide a monolithic solution. The monolithic solution avoids the loss that may be associated with an integrated optical combiner. The AWG for example, has low loss, does not need exacting vertically etched mirrors and is readily integrated with active elements.

Figure 8:
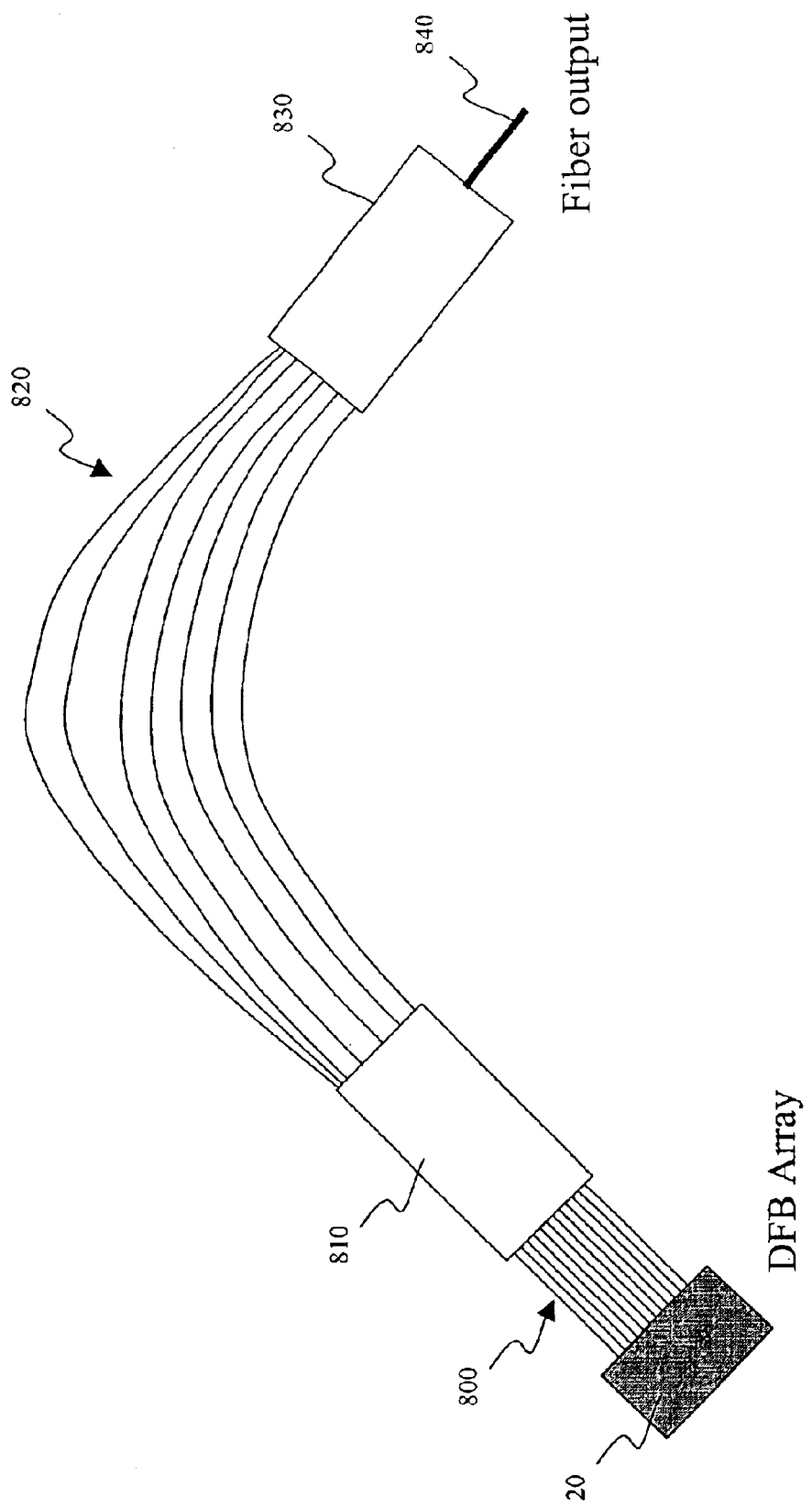
FIG. 8 illustrates another embodiment of an optical communications system for combining a plurality of transmit optical beams transmitted at a plurality of different optical wavelengths by a laser array into a single fiber.

Referring to FIG. 8, in another embodiment an arrayed waveguide grating (AWG) couples the outputs from the plurality of optical sources in the DFB laser array 20 into a common optical fiber. In this embodiment the AWG includes an input waveguide 800 coupled to the laser array 20 to receive the transmitted optical beams. The input waveguide 800 is coupled with a first waveguide coupler 810 which in turn is coupled with an array of waveguides 820. The array of waveguides 820 terminate in a second waveguide coupler 830 which is coupled to an output optical fiber 840.

In an exemplary embodiment the length of the individual waveguides and shape of the couplers are chosen so that input beams of predetermined wavelengths pass through the array of waveguides and create a diffraction pattern on the output optical fiber 840. The AWG therefore couples the plurality of input beams into a single output. (see U.S. patent application Ser. No. 10/000,142, filed Oct. 30, 2001, entitled TUNABLE CONTROLLED LASER ARRAY, the disclosure of which is incorporated by reference).

Arrayed waveguide gratings may be used as demultiplexers in the receiving end of a WDM link. These AWGs may be fabricated in silica-on-silicon. However, AWGs formed from InP waveguides may also be used as dispersive components monolithically integrated with an array of InP detectors to form a multi-channel receiver. Similarly, AWGs may be integrated into the laser cavity of an optoelectronic source to provide feedback to determine the lasing wavelength. However, the longitudinal modes of such devices are unstable due to the long cavity length.

Similarly, dispersive components such as PHASARS or AWGs may also be integrated with with an array of distributed Bragg relfectors (DBRs) lasers. However, in these devices the DBRs are only tunable over a narrow frequency range and the AWG only works to combine the output of all the lasers into a single waveguide, and is not part of the lasing cavity.

In the present invention the DFB laser array includes quarter-wave phase shifts to provide high modal stability. Thus all the lasers stay single mode with high side-mode-suppression-ratios. In addition, in the described exemplary embodiment the dependence of the wavelength of the optical beams transmitted by the laser array is approximately equal to the wavelength dependence of the AWG. Therefore, as the temperature of the chip is changed, the wavelength of the DFB array and the AWG shift together maintaining alignment between the DF array and AWG as well as the tuning of the grating.

In one embodiment the drive current of individual lasers is varied to fine tune the output wavelength of individual device so that the entire array is properly registered in wavelength to the AWG. Varying the drive current of individual devices has the parasitic effect of changing the power emitted by each laser. However, the mismatch in registration between the wavelengths of the AWG and the laser array generally has a much larger effect on the total output power. In fact, equal power can often be obtained from all channels if the current to each laser is properly adjusted, since the sharp wavelength characteristics of the AWG moderate any increase in laser power obtained by increasing the lasing current.

Additionally in one embodiment resistive elements are coupled to each laser stripe to fine tune the temperature and wavelength of individual lasers on a per laser stripe basis as described with respect to FIG. 5. Examples of structures and methods for tuning on a per laser stripe basis may be found, for example, in U.S. patent application Ser. No. 10/000,141, filed Oct. 30, 2001, entitled LASER THERMAL TUNING, integrated heaters can also be used to fine tune the wavelength of each laser.

In this embodiment the AWG and the DFB array are monolithically formed on a single chip. Therefore, in this embodiment, the DFB array and AWG are automatically aligned by the lithographic process used to fabricate the chip. For example, in one embodiment the active waveguide is formed over the entire wafer. However, the heavy doping typically used in the p-type cladding of many lasers would absorb too much light in the AWG. Similary, the quantum wells in the laser active region would present too much loss in the AWG structure. Therefore, in some embodiments the upper cladding and active region comprising one or more quantum wells in the passive region of the chip occupied by the AWG are removed by a standard etching process.

In this embodiment a non-absorbing waveguide and an undoped upper cladding are then re-grown on this passive region of the chip. In this embodiment the AWG waveguide contains a non-absorbing waveguide, where the bandgap of the core region is sufficiently higher than the operating wavelengths to present negligible absorption. In addition, the waveguide structure of both the AWG and the laser are, by way of example, formed together in a single mask step, using a ridge or a buried process.

An alternate embodiment uses a continuous waveguide under the active region in lieu of the direct coupled method described above. Alternatively, two vertically coupled waveguides with transition regions between the active and the passive sections are used in some embodiments.

Although this invention has been described in certain specific embodiments, many additional modifications and variations would be apparent to one skilled in the art. It is therefore to be understood that this invention may be practiced otherwise than is specifically described. Thus, the present embodiments of the invention should be considered in all respects as illustrative and not restrictive. The scope of the invention to be indicated by the appended claims, their equivalents, and claims supported by the specification rather than the foregoing description.

What is claimed is:

1. An optical communication system comprising:
    a laser array having a plurality of laser transmitters transmitting a plurality of optical beams at a plurality of different wavelengths;
    a virtual image phased array optically coupled to said laser array, each of the plurality of optical beams incident on the virtual image phased array at a corresponding angle of incidence, wherein the ratio of the difference in the angle of incidence between optical beams and the difference in wavelength between optical beams is approximately equal to the angular dispersion of the virtual image phased array, whereby the virtual image phased array combines the plurality of optical beams into a combined optical beam; and
    an optical communication media optically coupled to the virtual image phased array, the optical communication media receiving the combined optical beam.

2. The optical communication system of claim 1 wherein each of the plurality of optical beams transmitted by the laser array is incident upon the virtual image phased array at a different angle of incidence.

3. The optical communication system of claim 2 wherein the angle of incidence on the virtual image phased array for each of the plurality of optical beams transmitted by the laser array varies in accordance with separation between adjacent laser transmitters.

4. The optical communication system of claim 1 further comprising a collimating lens optically coupled between the laser array and virtual image phased array, wherein the collimating lens collimates the optical beams, with the collimated optical beams incident on the virtual image phased array.

5. The optical communication system of claim 4 further comprising a cylindrical lens optically coupled to the virtual image phased array, wherein the cylindrical lens receives the combined optical beam and passes the combined optical beam to a focusing lens that focuses the combined optical beam into the optical communication media.

6. The optical communication system of claim 1 further comprising a receiver coupled to the optical communication media.

7. The optical communication system of claim 1 further comprising one or more electro-absorption modulators monolithically integrated with one or more of the plurality of laser transmitters in the laser array, wherein the electro-absorption modulators modulate the optical beam of a corresponding laser transmitter in accordance with an information signal.

8. The communication system of claim 7 wherein the virtual image phased array comprises a plate formed from optically transparent material having a first reflective coating formed on a first portion of a first side of the plate and a second reflective coating formed on a first portion of a second side of a plate and a low reflectivity region for receiving the transmit optical beams.

* * * * *